(12) United States Patent
Wortberg et al.

(10) Patent No.: US 8,837,150 B2
(45) Date of Patent: Sep. 16, 2014

(54) ELECTRONIC DEVICE FOR SWITCHING CURRENTS AND METHOD FOR PRODUCING THE SAME

(75) Inventors: Michael Wortberg, Dorfen (DE); Christian Hausperger, Bonbruck (DE); Marcus Josef Auer, Salzburg-Aigen (AT)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 267 days.

(21) Appl. No.: 13/496,131

(22) PCT Filed: Sep. 15, 2010

(86) PCT No.: PCT/EP2010/063522
§ 371 (c)(1),
(2), (4) Date: Jun. 1, 2012

(87) PCT Pub. No.: WO2011/032966
PCT Pub. Date: Mar. 24, 2011

(65) Prior Publication Data
US 2012/0236504 A1    Sep. 20, 2012

(30) Foreign Application Priority Data
Sep. 15, 2009 (DE) .......................... 10 2009 029 476

(51) Int. Cl.
| | |
|---|---|
| *H05K 7/20* | (2006.01) |
| *H05K 1/18* | (2006.01) |
| *H01L 23/50* | (2006.01) |
| *H01L 23/498* | (2006.01) |
| *H01L 23/373* | (2006.01) |
| *H01L 25/07* | (2006.01) |
| *H01L 23/00* | (2006.01) |

(52) U.S. Cl.
CPC ....... *H01L 23/50* (2013.01); *H01L 2924/01057* (2013.01); *H01L 23/49811* (2013.01); *H01L 23/3735* (2013.01); *H01L 25/072* (2013.01); *H01L 2924/13091* (2013.01); *H01L 2224/48091* (2013.01); *H01L 2924/01078* (2013.01); *H01L 24/48* (2013.01); *H01L 2924/19107* (2013.01); *H01L 2224/4903* (2013.01)
USPC ...... 361/707; 361/679.54; 361/704; 361/715; 361/719; 165/80.2; 165/80.3; 165/104.33; 257/691; 257/707; 257/709

(58) Field of Classification Search
USPC .................. 361/679.46, 679.54, 648, 637, 361/704–715, 719–724, 803; 307/10.8, 42; 363/95, 97, 98, 131, 144, 146, 147, 363/132, 141; 174/252–267, 17 A, 17 R; 165/80.2, 80.3, 80.4, 104.33, 185; 257/678, 691, 703, 707, 709, 730, 731
See application file for complete search history.

(56) References Cited

U.S. PATENT DOCUMENTS

| | | | |
|---|---|---|---|
| 5,057,970 A | 10/1991 | Chave | |
| 5,153,449 A * | 10/1992 | Crook et al. | 307/66 |
| 5,170,322 A | 12/1992 | Von Guttenberg | |
| 5,740,002 A | 4/1998 | Jenns et al. | |
| 6,127,727 A * | 10/2000 | Eytcheson | 257/692 |
| 6,215,681 B1 * | 4/2001 | Schuurman et al. | 363/141 |
| 6,295,201 B1 * | 9/2001 | Ogden et al. | 361/704 |
| 6,373,705 B1 | 4/2002 | Koelle et al. | |
| 6,678,182 B2 * | 1/2004 | Joseph et al. | 363/141 |
| 6,757,175 B1 * | 6/2004 | Bartley et al. | 361/775 |
| 6,924,985 B2 * | 8/2005 | Kawakita et al. | 361/715 |
| 7,023,086 B2 | 4/2006 | Gutsmann et al. | |
| 7,035,105 B2 * | 4/2006 | Yamaguchi | 361/707 |
| 7,099,155 B2 * | 8/2006 | Kobayashi et al. | 361/719 |
| 7,203,073 B2 | 4/2007 | Kawakita et al. | |
| 7,335,035 B2 * | 2/2008 | Shirota | 439/76.2 |
| 7,800,213 B2 * | 9/2010 | Bayerer | 257/691 |
| 8,354,816 B2 * | 1/2013 | Ward et al. | 318/800 |
| 2005/0099778 A1 * | 5/2005 | Nakanishi | 361/704 |
| 2005/0128706 A1 * | 6/2005 | Maly et al. | 361/699 |
| 2006/0138633 A1 * | 6/2006 | Naruse et al. | 257/688 |
| 2008/0266812 A1 | 10/2008 | Steger et al. | |
| 2009/0098747 A1 | 4/2009 | Ikeda | |
| 2009/0098748 A1 | 4/2009 | Ikeda | |

| | | | |
|---|---|---|---|
| 2009/0161301 A1 | 6/2009 | Woody et al. | |
| 2010/0007006 A1* | 1/2010 | Job Doraisamy et al. | 257/691 |
| 2010/0089607 A1 | 4/2010 | Nakamura et al. | |
| 2010/0091464 A1* | 4/2010 | Ohnishi et al. | 361/723 |
| 2010/0212943 A1 | 8/2010 | Arifuku et al. | |

FOREIGN PATENT DOCUMENTS

| | | | |
|---|---|---|---|
| CN | 101622779 A | 1/2010 | |
| DE | 690 07 419 T2 | 6/1994 | |
| DE | 196 25 249 A1 | 1/1998 | |
| DE | 199 00 603 A1 | 7/2000 | |
| DE | 101 59 851 A1 | 6/2003 | |
| DE | 10 2004 018 469 B3 | 10/2005 | |
| DE | 101 34 187 B4 | 9/2006 | |
| DE | 10 2006 033 175 A1 | 1/2008 | |
| DE | 10 2007 016 222 B3 | 11/2008 | |
| DE | 10 2008 050 626 A1 | 7/2009 | |
| DE | 10 2008 050 627 A1 | 7/2009 | |
| DE | 11 2008 000 466 T5 | 1/2010 | |
| EP | 0 484 587 B1 | 7/1995 | |
| EP | 0 685 939 B1 | 2/1998 | |
| EP | 1 119 228 A2 | 7/2001 | |
| EP | 1 083 780 B1 | 11/2005 | |
| EP | 1 601 012 A2 | 11/2005 | |
| EP | 1 601 239 B1 | 6/2007 | |
| JP | 02005354786 A * | 12/2005 | H02G 3/16 |
| JP | 02006087173 A * | 3/2006 | H02G 3/16 |
| JP | 2006/262664 A | 9/2006 | |
| JP | 02006296072 A * | 10/2006 | H02G 3/08 |
| JP | 2008/206363 A | 9/2008 | |
| JP | 02009141288 A * | 6/2009 | H01L 25/07 |
| WO | WO 2008/010294 A1 | 1/2008 | |

OTHER PUBLICATIONS

International Search Report, International Report on Patentability, and Written Opinion for International application No. PCT/EP2010/063522, dated Nov. 30, 2010 (10 pages).

* cited by examiner

*Primary Examiner* — Michail V Datskovskiy

(74) *Attorney, Agent, or Firm* — Wolf, Greenfield & Sacks, P.C.

(57) ABSTRACT

The present invention relates to an electronic device for switching currents and a method for producing such a device that is reliable and durable. Such an electronic device comprises a power semiconductor that can be actuated for switching between at least two states; a substrate having thermomechanical properties compatible with the power semiconductor on which the power semiconductor is disposed on one side; a bus bar disposed on the other side of the substrate for conducting the current, wherein the substrate and the bus bar are coupled to each other such that a heat-conductive connection is provided so that heat can be dissipated from the power semiconductor to the bus bar.

16 Claims, 8 Drawing Sheets

ELECTRONIC DEVICE FOR SWITCHING CURRENTS AND METHOD FOR PRODUCING THE SAME

RELATED CASE INFORMATION

This application is a 371 US National Stage Application of International Application No. PCT/EP2010/063522, filed on Sep. 15, 2010, claiming priority to German application no. DE 10 2009 029 476.7, filed on Sep. 15, 2009, the entire disclosures of which are incorporated herein by reference.

FIELD OF THE INVENTION

The present invention relates to an electronic device for switching currents and a method for producing the electronic device, and in particular an electronic device that is designed for use in a vehicle.

PRIOR ART

In electric cables, e.g. in a car, it is usual for there to be a current flow of up to 1000 amperes, for example when starting up an internal combustion engine by means of an electric starter motor. High currents of up to 1000 amperes generally only occur briefly as current peaks. However, longer lasting current flows in the range of 30 amperes are no rarity. Electromagnetic relays are conventionally used for switching such load currents.

Of late, these electromagnetic relays have been increasingly replaced by power semiconductors, and this leads to new technical challenges as regards the structure and the connection technology for use of the power semiconductors in current distributors.

It is known to solder housed semiconductors as SMD (Surface Mounted Device) components onto a circuit board. SMD/THT (Through Hole Technology) standard processes are used here for production. However, a large amount of installation space is required for housed semiconductors. Furthermore, the thermal cycle stability of the semiconductors is restricted and heat produced in the semiconductor must be discharged via the circuit board or plate. Despite the use of thermal vias or inlays, such an arrangement is only sufficiently reliably suitable for installation spaces at a temperature of up to 85° C.

On the other hand, it has been proposed to solder and bond so-called bare die semiconductors onto a ceramic substrate. Contacts and/or bus bars are overmoulded with plastic and held in a housing. A connection between a punch grid, which can be used as a current distributor, and the circuit board can be made, for example, by means of bonding wires. In order to discharge heat a large cooling element is provided here under the substrate which has a number of column-like projections in order to enlarge the surface of the latter. High thermal cyclisation of the bare semiconductor can thus be achieved.

However, the cooling element requires a lot of space and must be sufficiently cooled by the ambient air. This leads to a large device which is connected by a number of complex and expensive bonding connections to the actuating electronics and different power lines which convey the load current. Cooling of the cooling element with ambient air constitutes a problem, in particular in the engine compartment of vehicles, due to the high temperatures that prevail here.

SUMMARY OF THE INVENTION

The object underlying the invention is to provide a reliable and durable electronic device for switching currents and a corresponding method for producing the same.

This object is achieved by an electronic device having the features of Claim 1 and by a production method having the features of Claim 16. Advantageous embodiments are described in the sub-claims.

According to one embodiment the electronic device for switching currents, in particular in a vehicle, comprises a power semiconductor that can be actuated for switching between at least two states; a substrate having thermomechanical properties compatible with the power semiconductor on which the power semiconductor is disposed on one side; and a bus bar disposed on the other side of the substrate for conducting a current, wherein the substrate and the bus bar are coupled to each other such that a heat-conductive connection is provided so that heat can be dissipated from the power semiconductor to the bus bar.

A power semiconductor can thus be cooled by heat conduction via a bus bar, and this is particularly advantageous for electronic devices in current distributor housings and/or in engine compartments since simple air cooling is not possible here due to very warm air and a small amount of air flow. By using a bus bar as a current conductor and heat conductor, the electronic device can additionally be greatly reduced in size, and parts, such as e.g. an extra cooling element, can be cut down on.

According to one advantageous embodiment the substrate contains ceramic. High thermal cyclisation of the power semiconductor on ceramic with similar expansion coefficients to that of the power semiconductor is thus possible. In particular, a power semiconductor can be cyclised to high temperatures of approximately 170° C., by means of which a good thermal gradient is produced in the bus bar.

According to one advantageous embodiment the substrate and the bus bar are coupled to one another by means of a heat-conductive layer. The heat can thus be discharged easily and efficiently via the heat-conductive connection optimised in this way. The heat-conductive layer preferably comprises a thermally conductive adhesive, a heat-conductive paste or a pad containing silicone.

The bus bar is electrically connected either directly or indirectly to the power semiconductor. With indirect connection the power semiconductor is for example connected to a circuit board and the latter is in turn connected to the bus bar.

According to a further advantageous embodiment the electronic device comprises a circuit board, the substrate and the power semiconductor forming a power module that is connected electrically to the circuit board. Different circuits can thus be formed according to normal processes on the circuit board which serves, for example, as a current bridge, by means of which the structure of the electronic device is simplified and standardised. Preferably the bus bar is disposed between the circuit board and the substrate.

According to a further advantageous embodiment the circuit board has connecting contacts for electrical connection to the power module via connection lines. The power module and the circuit board can thus be connected to one another electrically by standardised soldering processes.

According to a further advantageous embodiment the electronic device comprises a measuring device for measuring the voltage drop over at least one of the connection lines. For example, the voltage drop over a connection line can serve as a measured variable for measuring the current which is carried by the device. For this purpose the microcontroller on the circuit board measures the voltage drop over the connection lines formed, for example, as lead frame pins and determines the current proportional to the voltage drop.

According to a further advantageous embodiment the bus bar is electrically connected to the circuit board by means of connection lines, e.g. soldering lugs. The bus bar thus serves to supply current to the circuit board which in turn is electrically connected to the power module.

According to an advantageous embodiment two bus bars are provided, the further bus bar being disposed on the one side of the substrate, and the substrate and the further bus bar being coupled to one another such that a heat-conductive connection is provided so that heat can be discharged from the power semiconductor to the further bus bar. Heat can thus be dissipated even more effectively.

According to a further advantageous embodiment two bus bars are provided, the further bus bar being disposed next to the first bus bar on the other side of the substrate. Heat can thus be dissipated even more effectively. In particular, the first bus bar and the second (further) bus bar are respectively connected by means of connection lines to the circuit board on the side facing the other bus bar, and the current conveyance is formed such that one of the bus bars serves as a current delivering bus bar and the other serves as a current dissipating bus bar. Two bus bars thus serve not only to conduct heat, but also as part of a current circuit.

In a further advantageous embodiment the electronic device comprises an actuating logic disposed on the circuit board. The power semiconductor and the actuating logic are thus separated, by means of which an actuating current circuit and a load current circuit can also be separated.

According to another advantageous embodiment a method for producing an electronic device comprises the following steps: attaching an actuatable power semiconductor to one side of a substrate with thermomechanical properties compatible to the power semiconductor, and disposing a bus bar, preferably with a heat-conductive layer, on the other side of the substrate so that the bus bar and the substrate are coupled to one another such as to provide a heat-conductive connection. An electronic device which is small and which dissipates heat well can thus advantageously be produced by a number of simple steps.

Further advantageous features of the invention are disclosed in the detailed description of the embodiments and in the claims.

BRIEF DESCRIPTION OF THE DRAWINGS

In the following the invention is described in detail by means of the attached drawings which show as follows.

DESCRIPTION OF THE EMBODIMENTS

In the following preferred embodiments of the present invention are described in detail with reference to the accompanying drawings. The same or corresponding elements in the different drawings are respectively identified herewith the same or similar reference numbers.

The preferred embodiments of the invention, which are described in detail below, are described in detail with reference to an electronic device for switching currents, in particular in an on-board vehicle power supply. However, it is noted that the following description only includes examples and should not be considered as restricting the invention.

Figure 1:
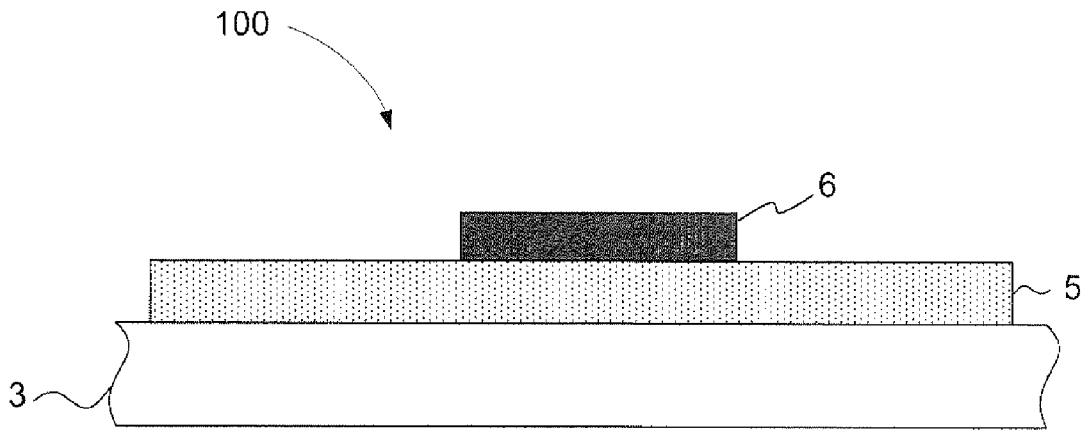
FIG. 1 shows diagrammatically an electronic device according to one embodiment.

FIG. 1 shows diagrammatically elements of an electronic device for switching currents, in particular load currents, and can be used, for example, in a vehicle. The electronic device 100 in FIG. 1 comprises a power semiconductor 6, a substrate 5 and a bus bar 3.

The power semiconductor 6 is, for example, a bare semiconductor and can be soldered and/or bonded onto the substrate 5.

The power semiconductor 6 can be actuated, for example by an actuating logic described below in order to switch between at least two states. For example, the power semiconductor 6 is in the form of a simple switch and closes or opens a current circuit. High load currents, for example when used in a vehicle, can occur here, and this can lead to a great increase in the temperature in the power semiconductor.

The power semiconductor or load switch can be produced, for example, as a power MOSFET, as described in patent application DE 10 2007 062 955. With high load currents a parallel circuit comprising a number of power MOSFETS is a possibility so that only parts of the load current respectively flow over a power MOSFET. Of course other field effect transistors can also be used instead of metal oxide semiconductor field effect transistors (MOSFETs) which can be switched over low gate voltages with minimal delay.

The high temperatures produced by the high currents can lead to thermally induced tensioning, i.e. the power semiconductor can expand. Therefore a substrate 5 with thermomechanical properties compatible to the power semiconductor 6 is provided. As shown in FIG. 1, the power semiconductor 6 is disposed on the upper side of the substrate. For example, the power semiconductor 6 can be fastened on the substrate 5 by soldering and bonding. Since the substrate has thermomechanical properties compatible to the power semiconductor, i.e. has similar characteristics to the power semiconductor 6 with regard to shape change with a temperature increase (or temperature reduction), damage to the power semiconductor 6 can be avoided due to different heat expansion of the substrate and the semiconductor.

Preferably a metal-ceramic substrate or a ceramic substrate with conductive paths is used as the substrate, the substrate having a similar expansion coefficient or heat expansion coefficient or one corresponding to the power semiconductor. For example, the expansion coefficients can differ by approximately 20%, and damage to the power semiconductor 6 due to different thermomechanical properties is thus still largely avoided. Since ceramic is a non-optimal heat conductor, a thin layer with a thickness of 0.3 to 1 mm, preferably 0.63 mm, is preferably used as a substrate.

As shown by FIG. 1, the bus bar 3 is disposed on the lower side of the substrate 5. The bus bar 3 serves to deliver or dissipate a load current and so can form part of a current circuit. The bus bar 3 can also be part of a punch grid or part of a current distributor system in a vehicle. For example, the bus bar 3 is made of punched copper sheet with a thickness of approximately 1 mm.

The substrate 5 and the bus bar 3 are coupled to one another such that a heat-conductive connection is provided so that heat can be dissipated from the power semiconductor 6 to the bus bar. In detail, heat generated in the power semiconductor 6 by high currents is delivered through the substrate 5, largely by heat conduction, to the bus bar 3 from where the heat can be dissipated further by a current distributor system. It is possible here to use a material which is well electrically conductive and thermally conductive, such as e.g. copper, as a material for the bus bar.

It is noted that with direct connection of the power semiconductor to the bus bar, the different thermomechanical properties, e.g. expansion coefficient, of the semiconductor material and the bus bar material lead to cracks possibly forming in the power semiconductor 6. This leads to reduced thermal cyclisability because after some temperature increases either the connection between the power semiconductor 6 and the substrate 5 is released or the power semiconductor 6 is damaged in some other way.

In order to connect the power semiconductor 6 and the bus bar 3 ductile solder containing lead, which can lead to problems relating to environmental protection, or expensive molybdenum solder pads would be required. Lead-free solder with molybdenum solder pads can easily become brittle, especially with a number of thermal cycles.

Moreover, bus bars should be tin-coated in order to provide corrosion protection for automotive applications. However, one can not bond onto a tin-coated contact side, and so partially tinned bus bars, which are complex to produce, must be used. These problems are avoided by means of inserts in the substrate 5 so that there is no direct connection between the power semiconductor 6 and the bus bar 3.

In order to improve the heat conduction between the bus bar 3 and the substrate 5, a heat-conductive layer can be introduced between the latter. The heat-conductive layer comprises, for example, a thermally conductive adhesive, a heat-conductive paste or a pad containing silicone. These are only some examples of a heat-conductive layer, and the person skilled in the art is familiar with other materials and layers with which a substrate, e.g. made of ceramic, and a bus bar, e.g. made of copper, can be coupled to one another such that good heat conductivity is provided.

Furthermore, it should be noted that no electric conduction is provided over the substrate 5 between the power semiconductor 6 and the bus bar 3 due to the non-conductive ceramic in the substrate 5. However, the bus bar 3 and the power semiconductor 6 can be connected to one another by conductive paths in the substrate 5 or other electrically conductive connections on and/or next to the substrate.

Figure 2:
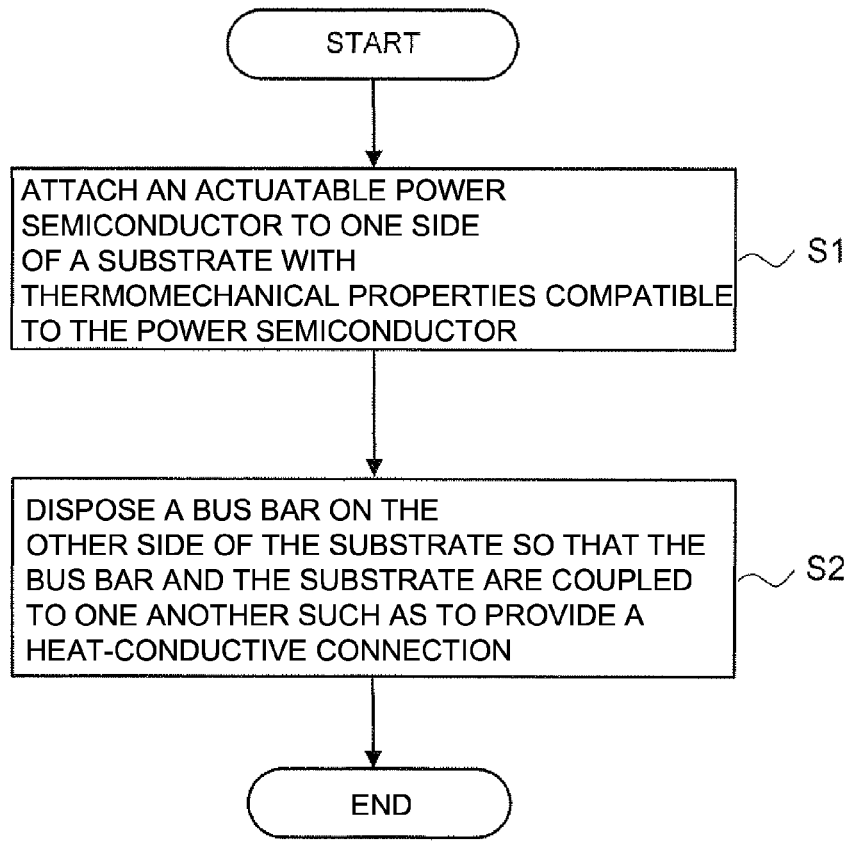
FIG. 2 shows a flow chart showing the steps of a production method for producing an electronic device according to a further embodiment.

FIG. 2 shows a flow chart with the steps of a method for producing an electronic device according to a further embodiment. In the first step S1 an actuatable power semiconductor is applied to one side of a substrate, e.g. substrate 5, with thermomechanical properties compatible to the power semiconductor.

In a second step S2 a bus bar, preferably with a heat-conductive layer, is then disposed on the other side of the substrate so that the bus bar and the substrate are coupled to one another such that a heat-conductive connection is provided.

Thus, by means of a few simple steps an electronic device, like the one shown in FIG. 1, can be produced. More specific electronic devices, which will be described below, can also be produced by adding further production steps such as to extend the electronic device described here. For example, a circuit board can be provided which has through connections which can simply be connected to the bus bar and the substrate beneath the power semiconductor.

Figure 3:
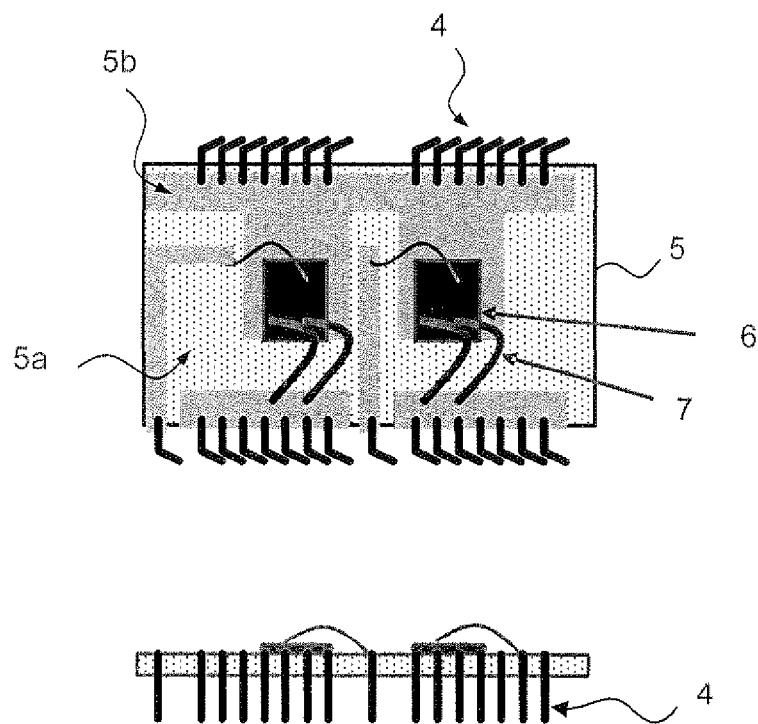
FIG. 3 shows a top view and side view of a power module.

In a top view and a side view FIG. 3 shows an example of how a power semiconductor 6 can be disposed on the substrate 5, connection lines 4 and 7 also being shown. In the following the combination of the substrate and the power semiconductor are called the power module, the power module shown in FIG. 3 having two power semiconductors.

In the top view in FIG. 3 the substrate 5 is in the form of a non-conductive, for example ceramic, substrate 5a, and has conductive paths 5b. The conductive paths 5b (grey) are connected to electric connection lines 4 and 7. On the sides of the substrate, in a soldering process lead frames are connected to solder pins so that the connection lines 4 (connection legs) constitute so-called lead frame pins which are connected to printed conductive paths on ceramic, for example. The power semiconductors 6 are soldered onto the substrate and bonded and, as shown in FIG. 3, the connection lines 7 between the power semiconductor 6 and a conductive path 5b on the substrate are in the form of bonding wires.

In the following a circuit board which is designed for use with the power semiconductor substrate and bus bar described above, is described in detail with reference to FIG. 4.

The circuit board 1 of FIG. 4 can be used as the base board in an electronic device described below. For example, an actuating logic 12 can be disposed on the circuit board 1. The actuating logic 12 can comprise a microcontroller or other type of control chip and serves to actuate power semiconductors so that the switching state of a power semiconductor can be chosen by the actuating logic 12. Separation of load currents and control currents is thus also possible, the control currents flowing over the actuating logic, and the load currents over the bus bar described above and the power semiconductor.

Figure 4:
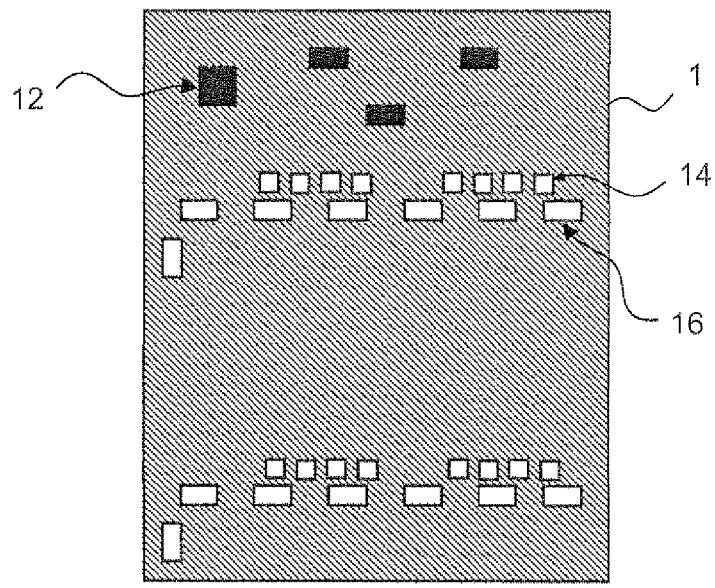
FIG. 4 shows a circuit board which forms part of the electronic device according to a further embodiment.

Furthermore, the circuit board 1 in FIG. 4 has a number of connecting contacts 14 and 16. The connecting contacts 14 are provided for connection lines to the power module described above. The connecting contacts 16 are provided for connection lines to the bus bar described above. The connecting contacts can be in the form of through-connections so that simple connection of the connection lines is possible. However, the connecting contacts can also constitute connector panels to which the connection lines, for example, can be soldered. As described below, a bus bar can have soldering tags as connection lines which are connected to the connecting contacts 16.

Figure 5:
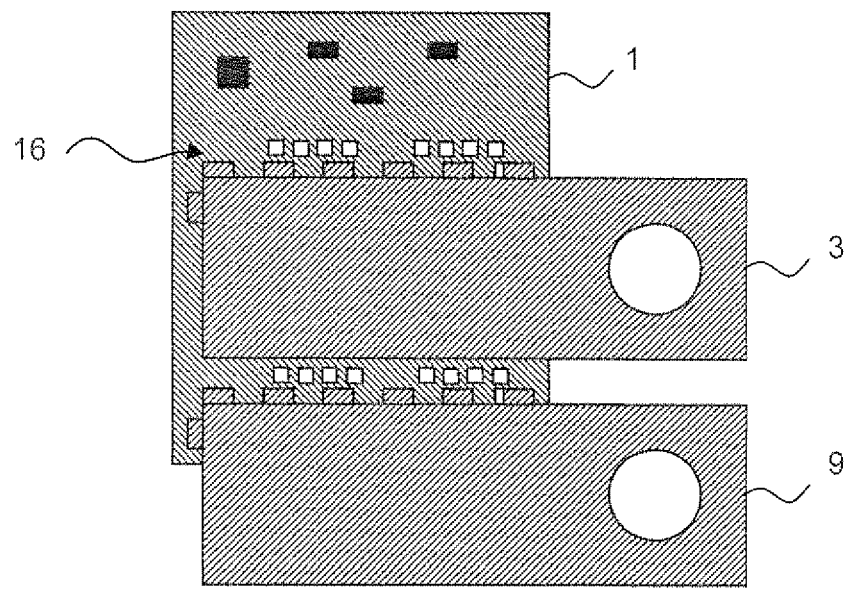
FIG. 5 shows how bus bars are arranged on the circuit board.
Figure 6:
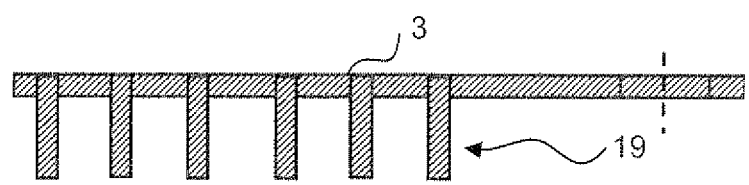
FIG. 6 shows a side view of a bus bar.

FIG. 5 shows a top view in which two bus bars 3 and 9 are disposed on the circuit board 1. As described in relation to FIG. 4, connection lines 19 shown in FIG. 6, for example soldering tags, of the bus bar 3 and 9 contact the connecting contacts 16. Here the bus bar 3 can, for example, be used as a current delivering bus bar, and the bus bar 9 as a current dissipating bus bar.

Figure 7:
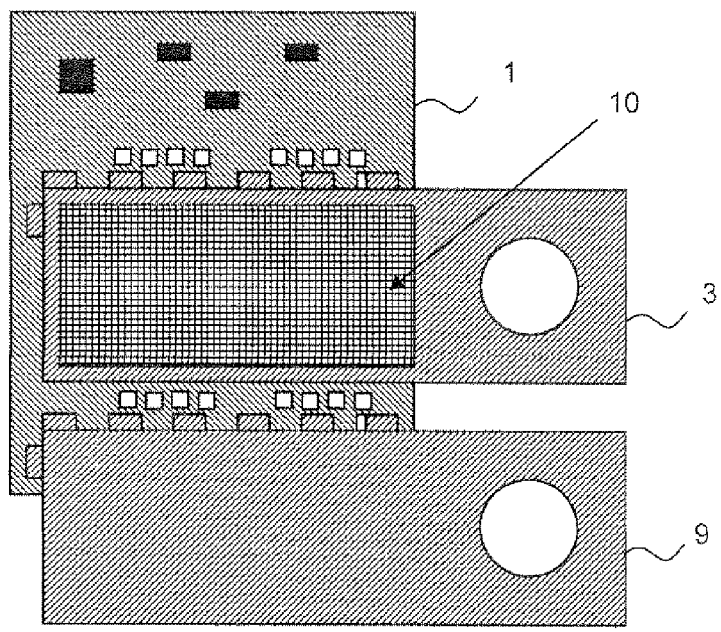
FIG. 7 shows bus bars on a circuit board, one of the bus bars having a heat-conductive layer.

In FIG. 7 the same circuit board 1 and bus bars 3 and 9 are represented as shown in FIG. 5. Additionally, a heat-conductive layer 10 is provided on the bus bar 3 which constitutes a so-called thermal interface in order to improve the thermal connection of a power module, as described in FIG. 3, to a bus bar. As already stated with regard to FIG. 1, the heat-conductive layer 10 can comprise a thermally conductive adhesive, a heat-conductive paste or a pad containing silicone.

Figure 8:
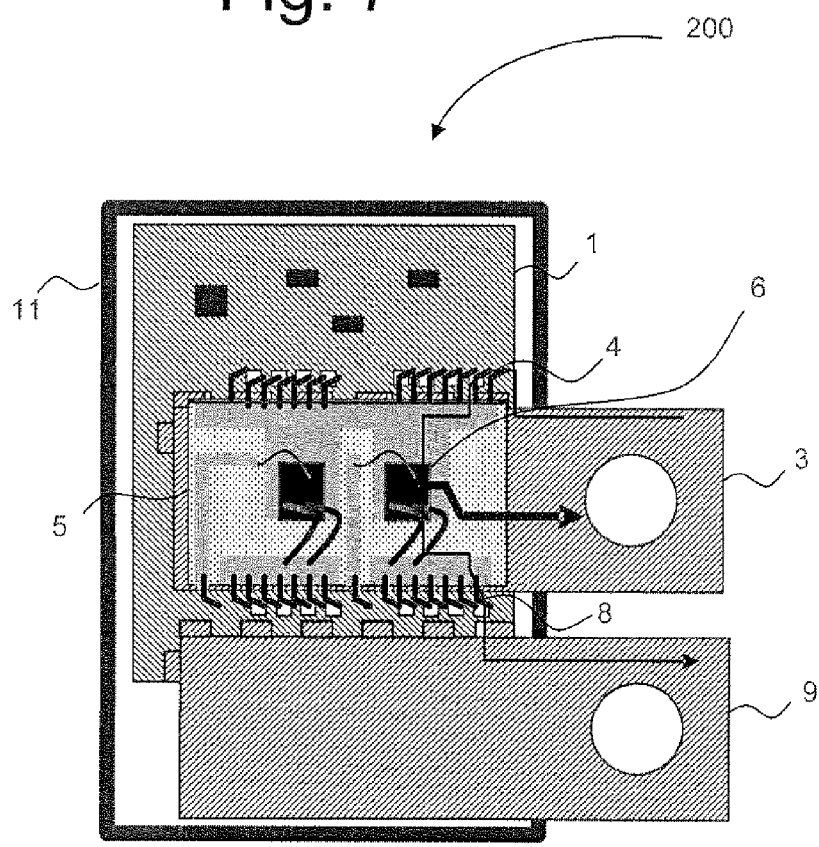
FIG. 8 shows an electronic device according to a further embodiment.

In the following an electronic device with a circuit board according to an embodiment relating to FIG. 8 is described.

In FIG. 8 the power module described in FIG. 3, and which comprises the substrate 5 and the power semiconductor 6, is disposed on the bus bar 3 of FIG. 5 (without a heat-conductive layer) or of FIG. 7 (with a heat-conductive layer). The power module can, for example, be positioned like a through-hole component. In a wave soldering process the circuit board 1, the bus bar 3 and the power module are connected to one another and can then be fitted in a housing 11, preferably made of plastic, or be overmoulded.

A current flow (thin arrow) and a heat flow (thick arrow) in the electronic device 200 is also shown in FIG. 8. In detail, in the connected through state of the power semiconductor 6 shown in FIG. 8, the current passes over the bus bar 3, i.e. current is fed via the bus bar 3 into the electronic device 200. After this the current flows via at least one soldering tag of the bus bar 3 onto the circuit board 1. From here the current flows only a short distance over the circuit board 1 and then via the connection lines 4 of the power module shown in FIG. 3 onto the metallisation (e.g. conductive path) of the substrate (see thin arrow).

Discharge of the current is implemented via the connection lines on the source side of the power semiconductor over the circuit board 1 and the soldering tags of the bus bar 9. In particular, as shown in FIG. 8, the current flows back through the connection lines 8 onto the circuit board 1 and from here via the soldering tags of the bus bar 9 onto the bus bar 9. As shown in FIG. 8, the connection lines of the power module and the soldering tags of the bus bar lie close to one another in order to achieve a good electric connection of the two. For reasons of clarity, no conductive paths or conductor structure are shown on the circuit board 1.

In the electronic device 200 of FIG. 8 the thermal connection of a power semiconductor to the current delivering bus bar 3, for example through the ceramic and the heat-conductive layer (thick arrow), and from here into the line set or into bus bars of a distributor which are connected heat conductively to the bus bar 3.

As shown in FIG. 8, the bus bar 3 is disposed between the circuit board 1 and the substrate 5 so that the connection lines are easily accessible and can easily be connected or soldered to corresponding contacts. However, it is also conceivable for the circuit board 1 to be fitted over the power module and the bus bar 3 so that the power module lies between the circuit board 1 and the bus bar 3.

Furthermore, the electronic device 200 can have a measuring device for measuring the voltage drop over at least one of the connection lines between the power module and the circuit board, i.e. over a lead frame pin. This voltage drop can advantageously serve as a measured variable for measuring the current which is carried by the device. For this purpose the microcontroller, which can be part of the actuating logic, measures the voltage drop on the circuit board by means of the lead frame pins and determines the current proportional to the voltage drop. For example, such a connection line (here in the form of a lead frame pin) can be produced from the material CuSn6. Since the latter has a very low temperature coefficient (⅙ of copper), a current measurement which is largely independent of the temperature and therefore accurate is possible. Therefore, one or more connection lines can replace an additional measuring shunt.

Figure 9:
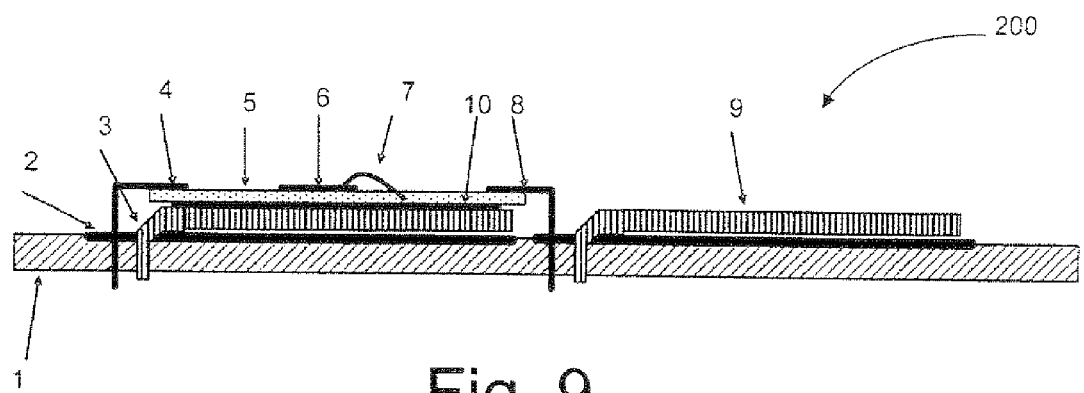
FIG. 9 shows a side view of the electronic device of FIG. 8.

FIG. 9 shows a side view of the electronic device 200 which was described in relation to FIG. 8.

In FIG. 9 the same reference numbers identify the same elements as in FIG. 8. In particular, a circuit board 1 is shown which has the actuating logic and conductive paths 2. The current delivering and heat discharging bus bar 3 is shown together with a soldering tag.

The current delivering connection lines 4 are soldered to the substrate 5 with solder pads, the substrate possibly having printed conductive paths which are not shown in the side view. The power semiconductor 6 is connected by a bonding wire 7 to the conductive paths of the substrate 5. The current dissipating connection lines 8 (lead frame pins) are soldered to the substrate with solder pads and are connected to the circuit board on the other side.

The heat-conductive layer 10 is shown between the substrate 5 and the bus bar 3. Furthermore, the bus bar 9 is shown with a soldering tag on a conductive path of the circuit board 1, by means of which the bus bar 9 is electrically connected to the connection line 8.

Figure 10A:
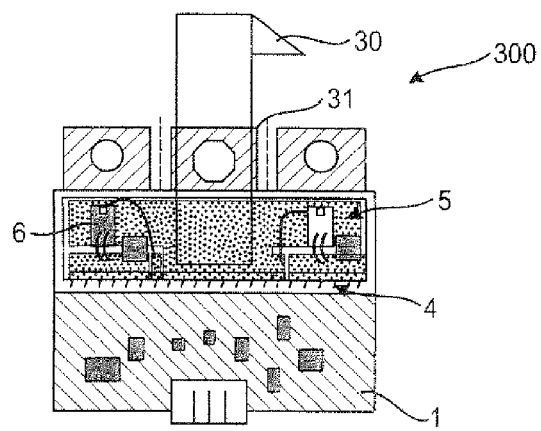
FIGS. 10A, 10B and 10C show a top view, side view and a side view rotated by 90° of an electronic device according to a further embodiment.
Figure 10B:
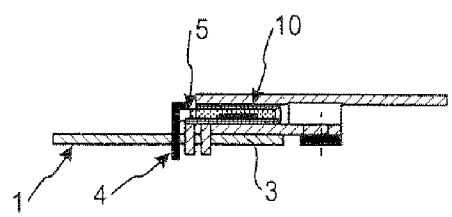
Figure 10C:
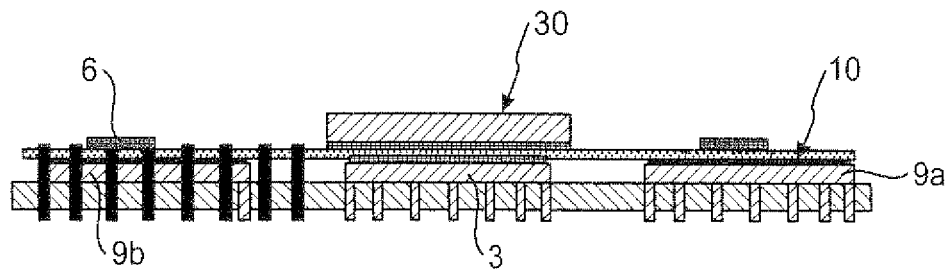

In FIGS. 10A to 10C an electronic device of a further embodiment is shown. FIG. 10A shows a top view of the electronic device 300 and FIGS. 10B and 10C show side views.

Figure 11:
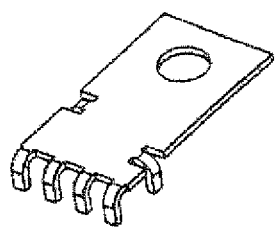
FIG. 11 shows an example of a bus bar with soldering lugs.

The electronic device has three bus bars 3, 9a and 9b with soldering tags, the middle bus bar 3 serving to deliver current, and the current being brought, furthermore, onto the substrate via the connection lines 4. The current discharge is implemented via the bus bars 9a and 9b. An example of a bus bar used in the electronic device 300 is shown in FIG. 11.

In this specific embodiment an additional external bus bar 30, which can be in the form of a battery bracket, is provided on the substrate and connected to the middle bus bar 3 with a screw connection and a spacer 31. This external bus bar 30 is elongated such that it lies centrally on the power module, fixes the latter and additionally dissipates heat.

The flow of current takes place from the external bus bar 30 to the bus bar 3 and from here through the connection lines 4 onto the substrate 5 and via further connection lines onto the bus bars 9a and 9b via the circuit board 1. The flow of heat takes place over the heat-conductive layer 10 which is provided between each bus bar and the substrate, as shown in FIG. 10c so that the heat can be discharged by the bus bars. In the electronic device 300, which is in the form of a double relay, the connection lines are disposed between the substrate and the circuit board, all on one side, and this simplifies production and is also described later with reference to FIGS. 12A and 12B.

Figure 12A:
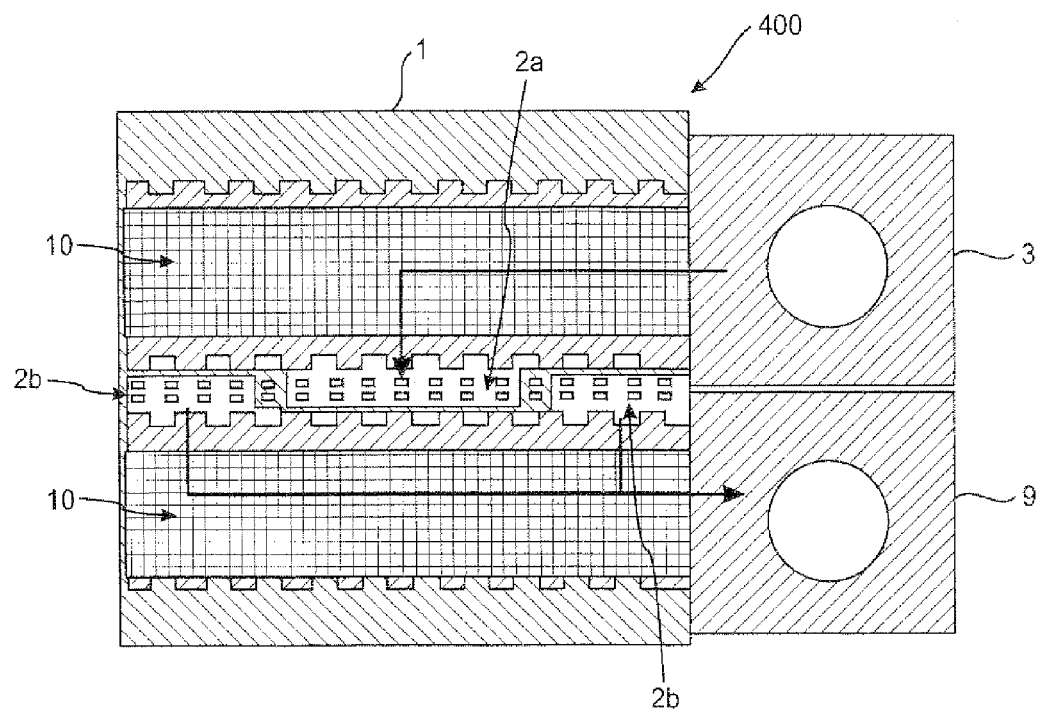
FIGS. 12A and 12B show an electronic device according to a further embodiment.
Figure 12B:
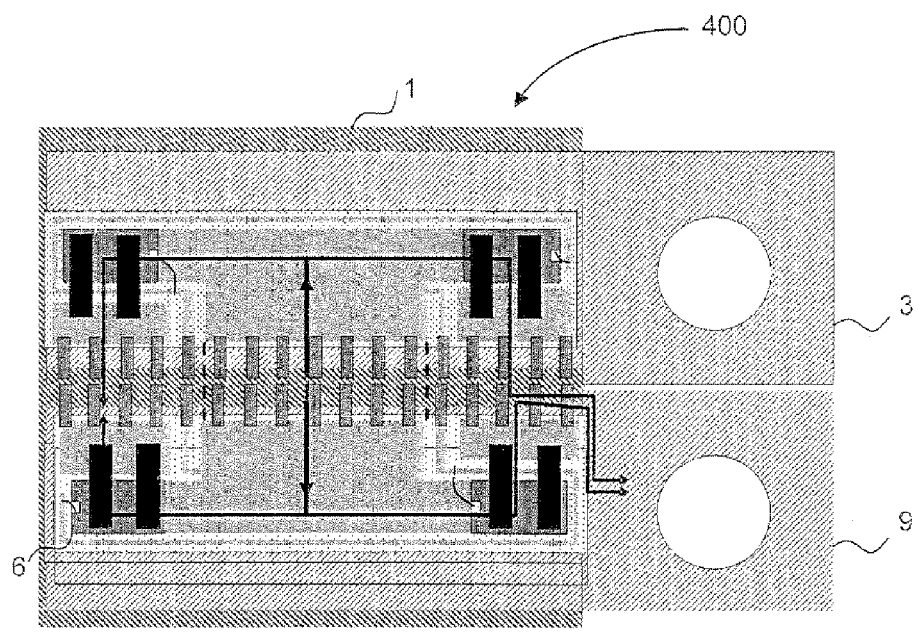

FIGS. 12A and 12B show an electronic device according to a specific embodiment. Here the bus bar 3 and the bus bar 9 are shown again, the bus bar 3 and the bus bar 9 respectively being connected to the circuit board 1 on the side facing the other bus bar. Therefore, as shown in FIG. 12A, connecting contacts for connection lines (lead frame pins) to one or more power modules need only be provided on one side. This simplifies the production process. An exemplary flow of current in the power modules shown in FIG. 12B is shown by the arrows in FIG. 12B, the bus bar 3 constituting the current delivering bus bar, and the bus bar 9 constituting the current dissipating bus bar.

The current flow from the bus bars to the conductive paths on the circuit board is shown by arrows in FIG. 12A, and the current flow from the conductive paths on the circuit board to and from the power semiconductors is shown by arrows in FIG. 12B.

In detail, as shown in FIG. 12A, a load current is delivered from the bus bar 3 to the middle conductive path 2a, from where connection lines distribute the current to the two substrates shown with respectively two power semiconductors (FIG. 12B). The current then flows back via connection lines to the conductive paths 2b on the circuit board, the conductive paths 2b being connected to the current dissipating bus bar 9 by means of, for example, soldering tags, so that the current can flow off via the bus bar 9.

Therefore, the arrangement of the electronic device 400 shown in FIGS. 12A and 12B makes possible a compact and space-saving device with four power semiconductors which respectively switch ¼ of the current delivered by the bus bar 3.

Figure 13:
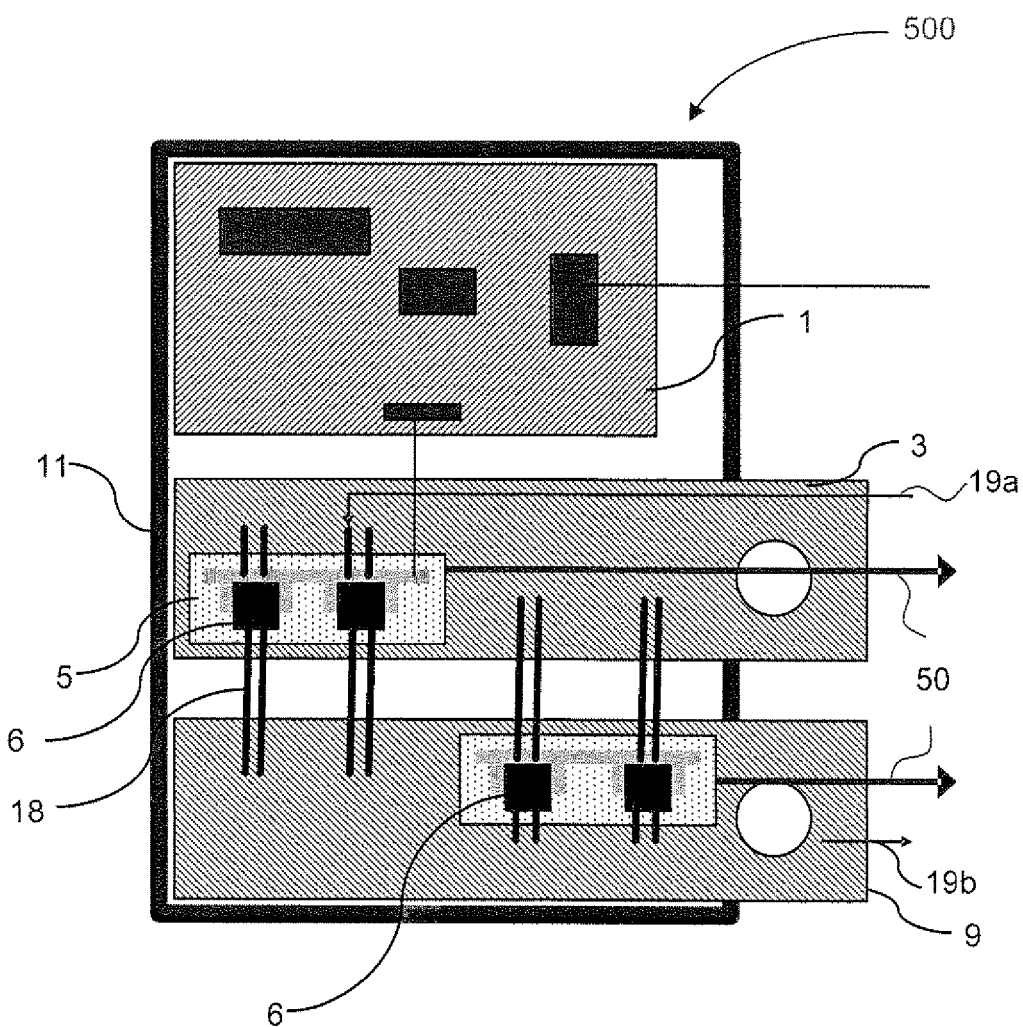
FIGS. 13 and 14 show another electronic device in a top view and side view according to a further embodiment.
Figure 14:
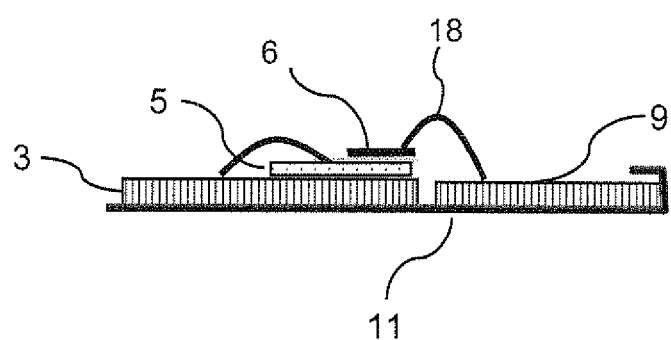

FIGS. 13 and 14 shown an electronic device 500 according to a further specific embodiment. Here the bus bar 3 and the bus bar 9 are shown again, the bus bars being electrically connected to one another by power modules comprising at least one power semiconductor 6 and substrate 5.

In FIG. 13 the bus bar 3 is shown as a current delivering bus bar (thin arrow 19a), and the further bus bar 9 is shown as a current dissipating bus bar (thin arrow 19b). For example, the bus bar 3 is connected by means of connection lines to a conductive path on the substrate 5, and the conductive path is in turn connected to a power semiconductor 6 on the substrate 5. The power semiconductor 6 of the bus bar 3 is in turn electrically connected to the bus bar 9 by means of connection lines 18. A side view of this arrangement is shown in FIG. 14.

Therefore, by means of the power modules shown in FIG. 13, a current from the bus bar 3 to the bus bar 9 can be interrupted and switched off. In the example shown in FIG. 13 the power semiconductors 6 are distributed over a number of bus bars in order to optimise the heat dissipation correspondingly via the bus bars, as shown by the arrows 50. Depending on the size of the current it is also possible to provide just one power semiconductor on the bus bar 3 and/or bus bar 9 or a number of power semiconductors.

As described in relation to the previous embodiments, an actuating logic located on a circuit board is electrically connected to at least one power module in order to actuate the latter by means of a connection line.

As described above in connection with the electronic devices 100, 200, 300, 400 and 500, these devices are capable of dissipating lost power in the form of heat of the power semiconductors without air convention being required, and this is particularly preferred in current distributors of vehicles due to little or no air convection. In particular, this is brought about by good thermal connection of a power semiconductor to a bus bar.

The use of a substrate lying in between leads to high thermal cyclisability of up to 170° C., by means of which the life span of the device and its reliability are increased. Since additional cooling elements are not required, the installation space and the weight of the device can also be reduced.

When using ceramic as a substrate, standard soldering processes can be used to connect the power semiconductor and the bus bar to the circuit board. Therefore a number of advantages can be obtained which are of great significance for the use of power semiconductors in vehicle electronics or other application areas with restricted air cooling.

The person skilled in the art also gathers from the above description that different modifications and variations of the devices shown and of the method of the invention can be implemented without straying from the scope of the invention.

Furthermore, the invention has been described in relation to specific examples which only serve, however, to give better understanding of the invention and are not intended to restrict the latter. The person skilled in the art also sees straight away that many different combinations of the elements can be used in order to implement the present invention. Therefore, the true scope of the invention is characterised by the following claims.

The invention claimed is:

1. An electronic device for switching currents, in particular in a vehicle, the electronic device comprising:
    a power semiconductor that can be actuated for switching between at least two states;
    a substrate having thermomechanical properties compatible with the power semiconductor on which the power semiconductor is disposed on a first side;
    a bus bar disposed on a second side of the substrate for conducting a current; and
    a circuit board, wherein the substrate and the power semiconductor form a power module that is connected electrically to the circuit board, and
    the substrate and the bus bar are coupled to each other such that a heat-conductive connection is provided so that heat can be dissipated from the power semiconductor to the bus bar.

2. The electronic device according to claim 1, wherein the substrate contains ceramic.

3. The electronic device according to claim 1, wherein the substrate and the bus bar are coupled to one another with a heat-conductive layer.

4. The electronic device according to claim 3, wherein the heat-conductive layer includes a thermally conductive adhesive, a heat-conductive paste or a pad containing silicone.

5. The electronic device according to claim 1, wherein the bus bar is connected electrically to the power semiconductor.

6. The electronic device according to claim 1, wherein the bus bar is disposed between the circuit board and the substrate.

7. The electronic device according to claim 1, wherein the circuit board has connecting contacts for electrical connection to the power module via connection lines.

8. The electronic device according to claim 7, further comprising a measuring device for measuring the voltage drop over at least one of the connection lines.

9. The electronic device according to claim 1, wherein the bus bar is electrically connected to the circuit board with soldering lugs.

10. The electronic device according to claim 1, further comprising a further bus bar.

11. The electronic device according to claim 10, wherein the further bus bar is disposed on the first side of the substrate, the substrate and the further bus bar being coupled to one another such that a heat-conductive connection is provided so that heat can be dissipated from the power semiconductor to the further bus bar.

12. The electronic device according to claim 10, wherein the further bus bar is disposed next to the bus bar on the second side of the substrate.

13. The electronic device according to claim 10, wherein the bus bar and the further bus bar are electrically connected, the current conveyance being formed such that one of the bus bars serves as a current delivering bus bar and the other serves as a current discharging bus bar.

14. The electronic device according to claim 10, wherein a substrate with at least one power semiconductor is disposed on each of the bus bars.

15. The electronic device according to claim 1, further comprising an actuating logic disposed on the circuit board.

16. A method for producing an electronic device, the method comprising acts of:
- attaching an actuatable power semiconductor to a first side of a substrate having thermomechanical properties compatible with the power semiconductor;
- disposing a bus bar on a second side of the substrate so that the bus bar and the substrate are coupled to one another such as to provide a heat-conductive connection; and
- electrically connecting a circuit board to a power module that is formed by the substrate and the power semiconductor.

\* \* \* \* \*

UNITED STATES PATENT AND TRADEMARK OFFICE
CERTIFICATE OF CORRECTION

| | | |
|---|---|---|
| PATENT NO. | : 8,837,150 B2 | Page 1 of 1 |
| APPLICATION NO. | : 13/496131 | |
| DATED | : September 16, 2014 | |
| INVENTOR(S) | : Michael Wortberg et al. | |

It is certified that error appears in the above-identified patent and that said Letters Patent is hereby corrected as shown below:

On the Title page, in item (30), replace "10 2009 029 476" with --10 2009 029 476.7--

Item (30) should read: Sept. 15, 2009 (DE) .......................... 10 2009 029 476.7

Signed and Sealed this
Twenty-third Day of December, 2014

Michelle K. Lee
*Deputy Director of the United States Patent and Trademark Office*